July 4, 1961 T. T. TRUE 2,991,357
AMPLITUDE MODULATED RADIO FREQUENCY TRANSMITTER
Filed Aug. 31, 1959
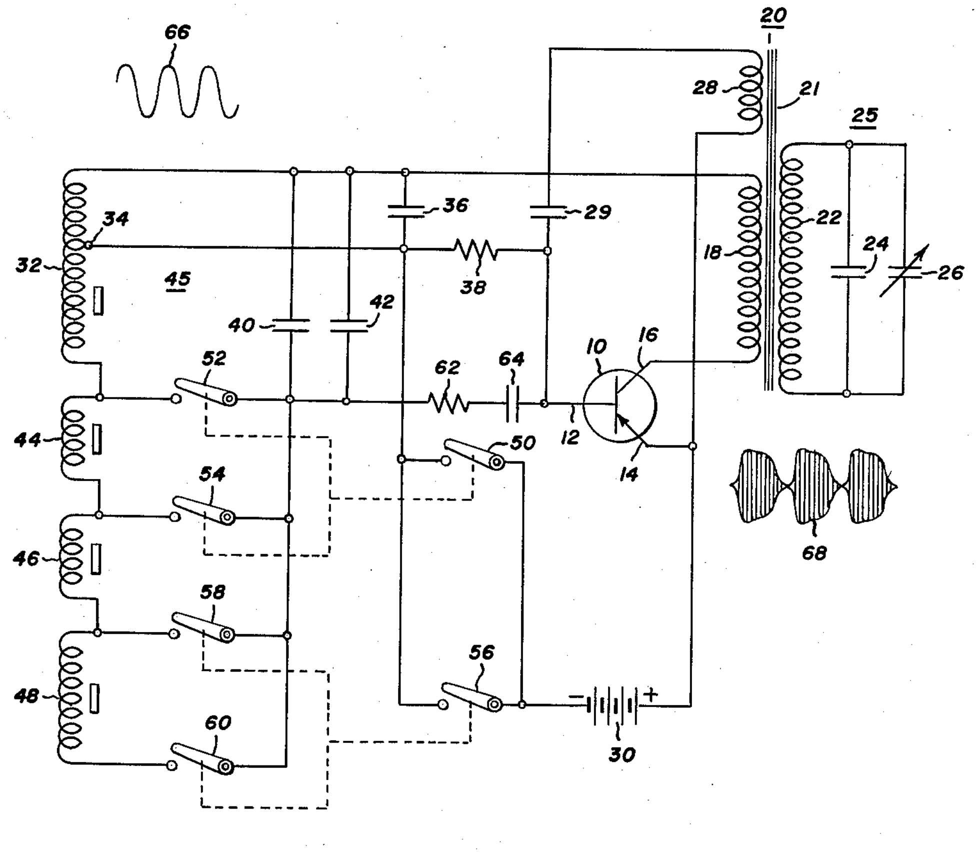
INVENTOR:
THOMAS T. TRUE,
BY Joseph Levinson
HIS ATTORNEY.

2,991,357
Patented July 4, 1961

2,991,357

AMPLITUDE MODULATED RADIO FREQUENCY TRANSMITTER

Thomas T. True, Camillus, N.Y., assignor to General Electric Company, a corporation of New York Filed Aug. 31, 1959, Ser. No. 837,077
4 Claims. (Cl. 250—17)

This invention relates to an amplitude modulated radio frequency transmitter suitable for use in remote control systems.

In remote control systems such as those employed for remotely controlling on-off, station selection, and volume in radio and television receivers, a transmitter, a standby receiver, and circuits operated by the receiver for performing the aforesaid functions are utilized. The number of frequencies which are used to perform the control functions depends on the number of functions to be controlled. In operation, the transmitter sends out a signal of a given frequency which is picked up by the receiver thereby activating the controlled circuit to perform the given function. The control circuit may include such devices as relays, switches, or motors or a combination thereof which is adapted to be activated or deactivated on the receipt of a given frequency.

A remote control transmitter for performing the aforesaid functions must be small, inexpensive, and reliable. The transmitter must also have good frequency stability and require a minimum of power.

Accordingly, it is an object of this invention to provide an amplitude modulated radio frequency transmitter which is both effective and economical for use in remote control systems.

A further object of this invention is to provide a new and improved amplitude modulated radio frequency transmitter which utilizes only a single transistor.

Still another object of this invention is to provide an amplitude modulated radio frequency transmitter which requires little power and exhibits good frequency stability.

In carrying out this invention in one illustrative embodiment thereof, a circuit is provided containing a single transistor which operates as a two-mode oscillator. Two tuned circuits are utilized with one being tuned to a carrier frequency and the other being tuned to an audio frequency. The tuned circuits are connected so as to be driven by the collector current of the transistor. Feedback currents are applied from each of the tuned circuits to the base of the transistor. Simultaneous oscillation is produced at the carrier frequency and the audio frequency, and the carrier frequency is amplitude modulated at the audio frequency rate.

These and other objects of this invention will be more clearly understood from the following description taken in connection with the accompanying drawing, and its scope will be apparent from the appended claims.

The drawing is a diagrammatic illustration of the amplitude modulated radio frequency transmitter embodied in this invention.

Referring now to the drawing, the remote control transmitter embodied in this invention employs a single transistor 10 having a base electrode 12, an emitter electrode 14 and a collector electrode 16. The emitter electrode 14 is connected to the positive terminal of a source of potential represented by a battery 30. The negative terminal of the battery 30 is connected through either a switch 50 or switch 56 to a biasing resistor 38 which is connected to the base electrode 12 of the transistor 10. The biasing resistor 38 provides a suitable biasing potential between the base electrode 12 and the emitter electrode 14 thereby biasing the emitter junction in a forward direction. It will be noted that the transistor 10 is a p-n-p type. However, it will be appreciated by those skilled in the art that an n-p-n type transistor may be used with reversal of biasing potential.

The collector electrode 16 is connected to the primary winding 18 of a transformer 20. A secondary winding 22 of the transformer 20 along with a capacitor 24 and a capacitor 26 which are shunted thereacross form a radio frequency tuned circuit 25. A feedback winding 28 on the transformer 20 is coupled on one end thereof to the emitter electrode 14 and on the other end thereof through a blocking capacitor 29 to the base electrode 12. The upper end of the primary winding 18 of the transformer 20 is coupled to the negative terminal of the battery 30 through a radio frequency by-pass capacitor 36 in parallel with a portion of coil 32, and either a switch 50 or switch 56 when closed thereby biasing the collector junction in reverse or back direction. The aforesaid portion of the amplitude modulated radio frequency transmitter constitutes the radio frequency carrier oscillator.

In the operation of the radio frequency oscillator, with the application of voltage to the collector electrode 16 by closing either switch 50 or switch 56, current flows in the primary winding 18 of the transformer 20. This current produces a radio frequency current in the tuned circuit 25. The RF current so induced into the tuned circuit 25 induces a voltage across the tickler or feedback winding 28 of the transformer 20. The voltage developed across the tickler winding 28 is then fed to the base 12 of the transistor 10 through the blocking capacitor 29. Oscillation is thereby sustained at the resonant frequency of the tuned circuit 25 because of the feedback voltage supplied by the tickler winding 28. The amount of feedback voltage is determined by the turns ratios and the coupling between the various windings of the transformer 20.

The audio modulating oscillator portion of the transmitter shown in the drawing includes a tuned circuit 45 which consists of four separate slug tuned coils 32, 44, 46 and 48 shunted by a capacitor 40 and a capacitor 42. The four slug tuned coils 32, 44, 46 and 48 are connected in series making them equivalent to one large coil having three taps thereon. Each of the taps represents a different audio frequency while the total inductance represents a fourth audio frequency. The taps are represented by a plurality of switches 52, 54, 58 and 60. The tuned circuit 45 is connected on one end thereof through the primary winding 18 of transformer 20 to the collector 16 of transistor 10. The other end of the tuned circuit 45 is coupled to the base electrode 12 of transistor 10 through a resistor 62 and a coupling capacitor 64 when any one of the switches 52, 54, 58 or 60 is closed. A tap 34 is provided on the coil 32 and is connected to the negative terminal of battery 30 when either switch 50 or 56 is closed. This allows a voltage to be developed at the lower end of any one of the coils which is 180° out-of-phase with the voltage above the tap 34 in order to permit the application of a feedback voltage of proper phase to maintain oscillation in the audio oscillator portion of the circuit.

In operation of the audio oscillator portion of the transmitter, the tuned circuit 45 is utilized for both the drive and feedback paths for the transistor 10. Voltage from the collector electrode 16 is developed across the bottom portion of the inductance, inducing a voltage of sufficient magnitude and of proper phase into the base circuit of the transistor 10 so as to sustain oscillation. This feedback voltage is coupled to the base 12 through the coupling capacitor 64, and the amplitude thereof is governed by the magnitude of the resistor 62. The waveform 66, as shown on the drawing, represents the voltage as measured across capacitor 40 which indicates sinusoidal oscillation at an audio frequency rate.

Since oscillation at an audio rate causes wide excursions of the collector voltage and base current, the RF carrier frequency signal is modulated at the audio frequency rate by the audio oscillator portion of the transmitter circuitry. This is shown on the drawing by the waveform 68 taken from an oscilliscope placed across the capacitor 26. The transformer 20 is wound on a ferrite rod 21 which radiates this amplitude modulated frequency 68.

Accordingly, the amplitude modulated radio frequency transmitter embodied in this invention operates as a two-mode oscillator, maintaining oscillation simultaneously at an RF carrier frequency and a low audio modulation frequency. The tuned circuits 25 and 45 are essentially connected in series and are driven by the collector current of the transistor 10. The feedback currents are applied in parallel to the base 12 of transistor 10. Proper phase inversion is achieved by inductively coupling in each of the tank circuits. Since simultaneous oscillation occurs, the RF carrier is envelope modulated by the low audio frequency signal. The two frequencies are relatively independent of each other so that exact carrier and modulation frequencies can be chosen independently.

The particular switching system which is shown is just one of many which could be utilized depending upon the number of frequencies which are to be transmitted to perform the particular control functions. In the illustrated switching arrangement the switches 52 and 54 are ganged with switch 50 such that when either switch 52 or 54 is depressed, switch 50 is also closed. Likewise, the switches 58 and 60 are ganged with switch 56 such that when either switch 58 or 60 is closed switch 56 is also closed. The switches 52, 54, 58 and 60 vary the inductance of the tuned circuit 45 and accordingly vary the audio modulating frequency. The switches 50 and 56 place a supply voltage upon the transistor 10 thereby making the transmitter operative.

The transformer 20 is provided with a ferrite rod 21 on which the windings of the transformer are wound. The ferrite rod radiates the amplitude modulated RF signal. To provide greater radiation, more ferrite can be used by substituting two transformers with two ferrite rods for the transformer 20 and ferrite rod 21 shown in the drawing. The operation of the circuit remains the same.

While it will be understood that the circuit specifications for the transmitter shown may vary according to any particular application or design, the following circuit parameters are included by way of example only as suitable for use with a center carrier frequency of 322.7 kc. tuneable over a bandwidth of at least 63 kc.:

| | | |
|---|---|---|
| Transistor **10** | | 2N139 |
| Battery **30** | volts | 9 |
| C **24** | micromicrofarads | 130 |
| C **26** | do | 25–280 |
| C **29** | do | 4700 |
| C **36** | microfarads | .1 |
| C **40** | do | .27 |
| C **42** | do | .045 |
| C **64** | do | .22 |
| R **38** | ohms | 47,000 |
| R **62** | do | 5600 |
| L **32** | mh | 650 |
| L **44** | mh | 110 |
| L **46** | mh | 130 |
| L **48** | mh | 175 |

As will be noted above, the transmitter embodied in this invention has a usable RF band spread. If two systems are used in close proximity, it is possible for one system to interfere with the other or vice versa. To eliminate this undesired interference, it is merely necessary to slightly shift the RF carrier frequency for one of the two systems.

The drawing illustrates a variation in inductance for tuning the tank circuit 45. As will be obvious to those skilled in the art, other forms of tuning may be utilized, as for example capacitive tuning by selectively varying the capacitance of the tuned circuit 45.

Since other modifications and changes varied to fit particular operating requirements and environments will be apparent to those skilled in the art, this invention is not considered limited to the examples chosen for purposes of disclosure and covers all modifications and changes which do not constitute departures from the true spirit and scope of this invention.

What I claim as new and desire to secure by Letters Patent of the United States is:

1. An amplitude modulated radio frequency transmitter comprising a transistor having a base, emitter and collector, a transformer having primary secondary and feedback windings, a source of potential having first and second terminals, means for coupling said emitter to the first terminal of said source of potential, means for coupling the primary winding of said transformer between said collector and said second terminal of said source of potential, means for coupling said feedback winding between said emitter and said base, a resistance, means for coupling said resistance between said base and the second terminal of said source of potential, a first tuned circuit including the secondary winding of said transformer tuned to a radio frequency, a second tuned circuit tuned to an audio frequency, means for coupling a point on said second tuned circuit to the second terminal of said source of potential, and means for coupling said second tuned circuit between said collector and said base.

2. An amplitude modulated radio frequency transmitter comprising a junction type transistor having a base, emitter and collector electrodes, means for forwardly biasing the emitter junction of said transistor, means for back biasing the collector junction of said transistor, a radio frequency tuned circuit coupled to said collector electrode, means for applying a feedback voltage from said radio frequency tuned circuit to said base electrode, an audio frequency tuned circuit coupled to said collector electrode, means for applying a feedback voltage from said audio frequency tuned circuit to said base electrode whereby the radio frequency signal of said radio frequency tuned circuit is amplitude modulated by the audio frequency signal of said audio signal tuned circuit by the action of said transistor, and means associated with said radio frequency tuned circuit for radiating the amplitude modulated signal so produced.

3. An amplitude modulated radio frequency transmitter comprising a transistor having base, emitter and collector electrodes, means for applying a forward bias between said base and emitter electrodes, means for applying a reverse bias between said base and collector electrodes, transformer means having primary, secondary and feedback windings wound on core means, means for connecting said primary winding to said collector electrode, a first tuned circuit including the secondary winding of said transformer means tuned to a radio frequency, means including said feedback winding for applying a feedback voltage from said first tuned circuit to said base electrode, a second tuned circuit coupled to said collector electrode which is tuned to an audio frequency, means for applying a feedback voltage from said second tuned circuit to base electrode whereby the radio frequency signal of said first tuned circuit is amplitude modulated by the audio frequency signal of said second tuned circuit by the action of said transistor to provide an amplitude modulated signal which is radiated by said core means.

4. An amplitude modulated radio frequency transmitter comprising a transistor having a base, emitter and collector, a transformer having primary, secondary and feedback windings, a source of potential having first and second terminals, means for coupling said emitter to the first terminal of said source of potential, means for coupling the primary winding of said transformer between said collector and said second terminal of said source of potential, means for coupling said feedback winding between said emitter and said base, a resistance, means for coupling said resistance between said base and the second terminal of said source of potential, a first tuned circuit including the secondary winding of said transformer tuned to a radio frequency, a second tuned circuit tuned to an audio frequency, said second tuned circuit having a plurality of serially connected windings therein, means for coupling a point on one of said windings to the second terminal of said source of potential, a plurality of switches in said second tuned circuit for connecting varying portions of said windings in said second tuned circuit, and means for coupling said second tuned circuit between said collector and said base.

References Cited in the file of this patent

UNITED STATES PATENTS

| | | |
|---|---|---|
| 2,006,440 | Chireix | July 2, 1935 |
| 2,836,724 | Kaminow | May 27, 1958 |
| 2,843,745 | Smith | July 15, 1958 |
| 2,855,568 | Lin | Oct. 7, 1958 |
| 2,866,653 | Lin | May 12, 1959 |